United States Patent
Kashima et al.

[11] Patent Number: 5,828,085
[45] Date of Patent: Oct. 27, 1998

[54] LIGHT EMITTING DIODE HAVING LIGHT-EMITTING AND LIGHT-ABSORBING REGIONS

[75] Inventors: Yasumasa Kashima; Tsutomu Munakata, both of Tokyo, Japan

[73] Assignee: Oki Electric Industry Co., Ltd., Tokyo, Japan

[21] Appl. No.: 907,126

[22] Filed: Aug. 6, 1997

[30] Foreign Application Priority Data

Aug. 8, 1996 [JP] Japan .................................. 8-226008

[51] Int. Cl.⁶ .................................................. H01L 27/15
[52] U.S. Cl. .............................. 257/80; 257/84; 257/85; 257/436
[58] Field of Search ............................ 257/80, 81, 82, 257/84, 85, 14, 21, 436; 372/50

[56] References Cited

U.S. PATENT DOCUMENTS 4,975,752  12/1990  Kashima et al. ......................... 257/85

FOREIGN PATENT DOCUMENTS 7-97661  10/1995  Japan .

OTHER PUBLICATIONS

Kashima et al., "Linear InGaAsP Edge–Emitting LED'S for Single–Mode Fiber Communications," Journal of Lightwave Technology, vol. 10, No. 11, Nov. 1992, pp. 1650–1655.

*Primary Examiner*—Minh-Loan Tran
*Attorney, Agent, or Firm*—Jones & Volentine, L.L.P.

[57] ABSTRACT

An active layer of a light-emitting diode is surrounded jointly by a pair of clad layers and a pair of block layers. The active layer includes a light-emitting portion and a light-absorbing portion which are continuously formed in one body. The light-emitting portion emits light when carriers are injected thereinto between the pair of clad layers, and the light-absorbing portion absorbs light coming from the light-emitting portion. A bandgap of the light-absorbing portion may be smaller than that of the light-emitting portion.

5 Claims, 3 Drawing Sheets

LIGHT EMITTING DIODE HAVING LIGHT-EMITTING AND LIGHT-ABSORBING REGIONS

BACKGROUND OF THE INVENTION

The present invention relates to a light-emitting diode and a manufacturing method therefor, and more particularly to an edge-emitting light-emitting diode for outputting light from its end facet and a manufacturing method therefor.

In a light-emitting diode, when facet reflection occurs in its optical waveguide, the stimulated emission of light caused by the facet reflection makes the emission of stable natural light difficult. For this reason, it has been proposed to form an active layer serving as the light-emitting portion at one end of the facet radiation type light-emitting diode and also form a light-absorbing portion made of an active layer aligned with the active layer serving as the light-emitting portion (Japanese Publication No. 7-97661).

According to the light-emitting diode including the light-absorbing portion, out of all the light emitted from the light-emitting portion, the light traveling through the light-emitting diode to the light-absorbing portion is absorbed by the light-absorbing portion, with the result that the facet reflection of the light can be prevented, making it possible to suppress the stimulated emission of light.

In the conventional light-emitting diode, however, between the active layer serving as the light-emitting portion and the active layer serving as the light-absorbing portion, there is the intervening InP block layer having a refractive index different from that of the InGaAsP active layer.

Accordingly, the light is refracted at the interface between the active layer and the block layer, and consequently all the light going from the light-emitting portion to the light-absorbing portion cannot be securely guided to the light-absorbing portion. For this reason, conventionally, a refracted portion of the light is likely to cause stimulated emission by facet reflection, and the emission characteristics are liable to deteriorate during operation at low temperature.

SUMMARY OF THE INVENTION

Accordingly, the object of the present invention is to provide for a light-emitting diode in which stimulated emission is prevented regardless of temperature changes and which therefore exhibits stable temperature characteristics.

To solve the above problems, the present invention adopts the following structure.

The light-emitting diode according to the present invention comprises an active layer formed on a substrate, which is surrounded jointly by a pair of clad layers and a pair of block layers, wherein the active layer includes a light-emitting portion and a light-absorbing portion, which are continuously formed in one body, the light-emitting portion emits light when carriers are injected thereinto between the pair of clad layers, and the light-absorbing portion absorbs the light coming from the light-emitting portion.

Therefore, in the light-emitting diode according to the present invention, the light-emitting portion and the light-absorbing portion are formed in the active layer functioning as the optical waveguide and therefore in this optical waveguide extending from the light-emitting portion to the light-absorbing portion, there are no changes in refractive index, which cause the light to reflect, so that the light going from the light-emitting portion to the light-absorbing portion can be securely guided to the light-absorbing portion.

Consequently, reflection in the light-emitting diode can be prevented reliably, and laser oscillation resulting from stimulated emission can be suppressed reliably, so that it is possible to further stabilize the temperature characteristics of the light-emitting diode.

By arranging the bandgap of the light-absorbing portion of the active layer such that it is smaller than that of the light-emitting portion, the light-absorbing efficiency of the light-absorbing portion can be improved.

By widening the spectral bandwidth by partially changing the bandgap in the light-emitting portion, light much closer to natural light can be obtained.

To the formation of the continuous active layer having a varying bandgap, a selective-area growth method, which is vapor phase opitaxy deposition using a pair of masks for selective-area growth, can be applied.

In this selective-area growth deposition method, it is preferable to use the organic metal vapor phase epitaxy deposition technique because this technique makes it possible to control the bandgap of the active layer relatively easily.

DESCRIPTION OF PREFERRED EMBODIMENTS

Description will be made in detail of the illustrated embodiments of the present invention.

Figure 1:
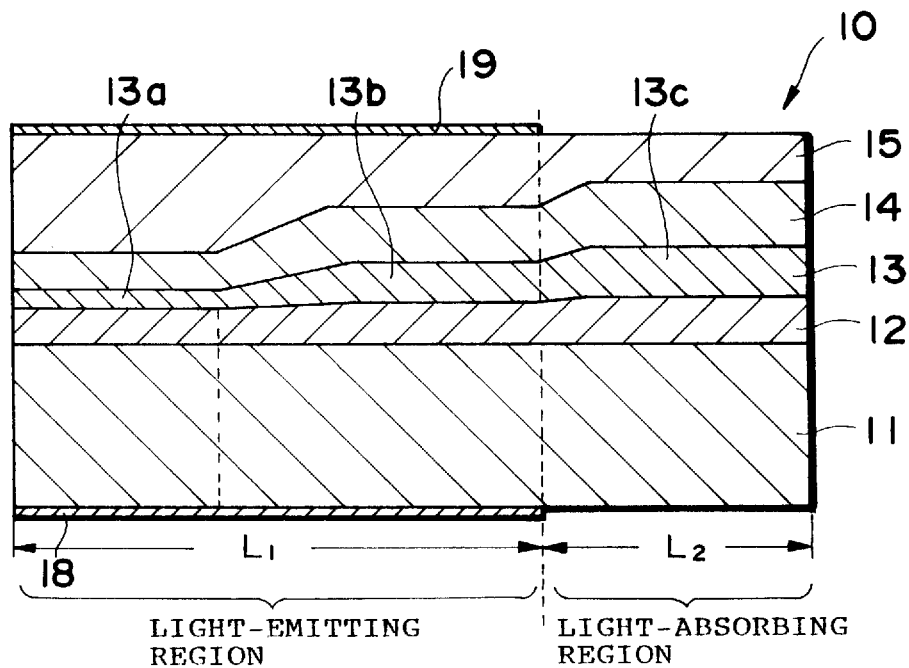
FIG. 1 is a longitudinal sectional view of a light-emitting diode according to the present invention.
Figure 2:
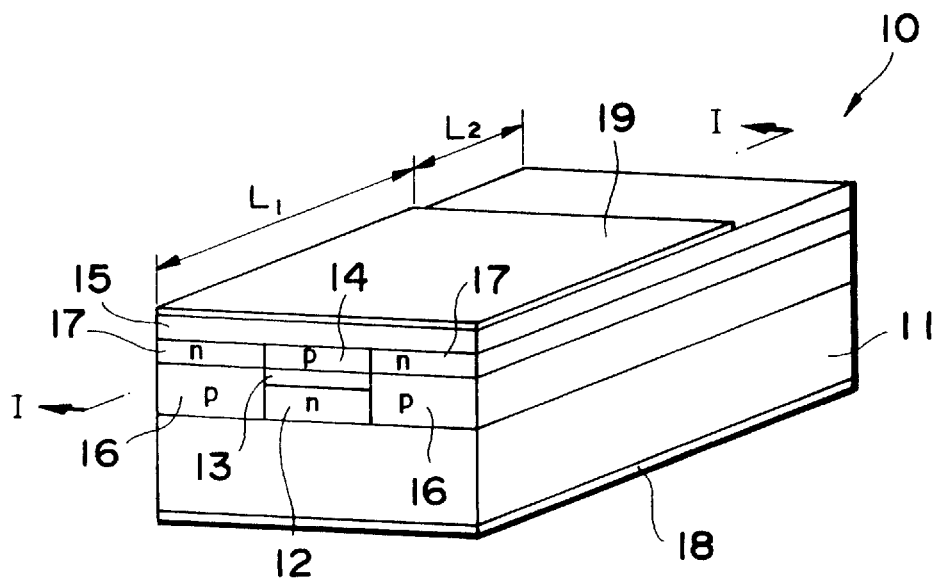
FIG. 2 is a perspective view of the light-emitting diode according to the present invention.

FIG. 1 is a longitudinal sectional view to show most plainly the characteristic of the light-emitting diode according to the present invention. FIG. 2 is a perspective view showing the whole of the light-emitting diode according to the present invention.

The light-emitting diode according to the present invention is described first with reference to FIG. 2 ahead of FIG. 1.

A light-emitting diode shown in FIG. 2 is an end face radiation type light-emitting diode which is formed in a layer-built structure of semiconductor materials, and uses the end face of the multilayer structure as the light-emitting face.

The light-emitting diode 10 according to the present invention comprises a semiconductor substrate 11 of n-type InP, for example, a first clad layer 12 formed of n-type InP, for example, located in the middle portion of and in the longitudinal direction of the substrate 11, an active layer 13 of undoped InGaAsP, for example, deposited on the first clad layer 12, a second clad layer 14 of p-type InP, for example, deposited on the active layer 13, and a contact layer 15 of InGaAsP, for example, formed to cover the second clad layer 14 and to be opposite the substrate 11 to provide an ohmic contact.

A first block layer 16 of p-type InP and a second block layer 17 of n-type InP are formed on lateral sides of the layer-built structure including the first clad layer 12, the active layer 13, and the second clad layer 14, between the substrate 11 and the contact layer 15.

As shown in FIG. 1, the active layer 13 extends over the full length in the longitudinal direction of the substrate 11 in such a manner that end faces of the active layer 13 are exposed at both ends in the longitudinal direction of the substrate 11. Also, the pair of clad layers 12 and 14, covering the top and bottom faces of the active layer 13, extend over the full length in the longitudinal direction of the substrate 11. Furthermore, as shown in FIG. 2, the pair of block layers 16 and 17 extend over the full length in the direction of the substrate 11.

Thus, the active layer 13 is provided on the substrate 11 in such a manner that the active layer 13 is surrounded jointly by those layers 12, 14, 16 and 17.

In the example shown in FIG. 1, the thickness of the active layer 13 becomes larger as one goes from the left region 13a at one end in the longitudinal direction, to the middle region 13b, and further to the right region 13c at the other end in the longitudinal direction of the active layer 13. As the active layer 13 increases in thickness from the region 13a to the region 13b and then to the region 13c, their energy bandgaps decrease in that order.

A pair of electrodes 18 and 19 are provided on the substrate 11 and the contact layer, respectively.

The electrodes 18 and 19 are formed over the length L1 from one end in the longitudinal direction of the substrate 11 to correspond to the left region 13a and the middle region 13b of the active layer 13. The electrodes 18 and 19 neither reach over the full length (L1+L2) in the longitudinal direction of the substrate 11, nor extend to the right region 13c of the active region 13. Therefore, those electrodes 18 and 19 are not formed in the region of the length L2 from the other end of the substrate 11.

Alternatively, the electrodes 18 and 19 can be formed throughout the overall length (L1+L2) of the substrate 11. In this case, an electrical insulating layer, not shown, is inserted in the region of the length L2 corresponding to the right region 13c between the electrodes 18 and 19, and between the substrate 11 and the contact layer 15.

When a negative electrode of a power source, not shown, is connected to the electrode 18 of the light-emitting diode 10 and a positive electrode of the power source is connected to the electrode 19 of the light-emitting diode 10, the carriers are injected into the left region 13a and the middle region 13b, placed between the electrodes 18 and 19, out of all the active region 13 formed between the n-type first clad layer 12 and the p-type second clad layer 14. By this injection of carriers, the two regions 13a and 13b of the active region 13 function as the light-emitting portions to produce spontaneous emission of wavelengths according to their energy bandgaps.

The pair of clad layers 12 and 14, by the differences in refractive index from the active layer 13, contain the light from the regions 13a and 13b within the active layer 13. Similarly, the pair of block layers 16 and 17, by the differences in refractive index from the active layer 13, contain the light within the active layer 13, and also exhibit a reverse-biasing characteristic to the current between the electrodes 18 and 19 to focus the current to the active layer 13, thereby enhancing the emission efficiency.

The spontaneous emission from the light-emitting portions (13a and 13b) of the active layer 13 is guided through the active layer 13 serving as the optical waveguide to the longitudinal direction thereof.

Of all the light led through the optical waveguide, the light guided toward the left end shown in FIG. 1 is emitted as spontaneous emission from one end of the active layer 13. On the other hand, the light guided through the active layer 13 serving as the optical waveguide to the opposite direction is absorbed appropriately in the region 13c formed to be continuous to the region 13b as a part of the light-emitting portion of the active layer 13.

Since the right region 13c functioning as the light absorber is formed to be continuous to the light-emitting portions (13a and 13b), the light going from the light-emitting portions (13a and 13b) to the light-absorbing portion (13c) never passes through a portion having sharp differences in refractive index as in the prior art. Therefore, the light traveling from the light-emitting portions (13a and 13b) to the light-absorbing portion (13c) is never made to scatter or the like caused by differences in refractive index, and can be securely guided to the light-absorbing portion (13c) and absorbed thereby.

Accordingly, the light from the light-emitting portions (13a and 13b) is prevented from undergoing end-face reflection at the other end of the active layer 13, in other words, end-face reflection can be always prevented and the stimulated emission due to this reflection is prevented reliably.

For this reason, in the light-emitting diode 10 according to the present invention, even if a relatively large current is conducted between the electrodes 18 and 19, the stimulated emission phenomenon, which often occurred in the past, can be prevented and the emission characteristics at low temperatures can be kept in good order.

Consequently, the light-emitting diode 10 continues to emit stable natural light.

The light-emitting portions (13a and 13b) of the active layer 13 and the light-absorbing portion 13c can be formed to have substantially the same energy bandgap. It is preferable, however, to arrange for the energy bandgap of the light-absorbing portion 13c to be smaller than those of the light-emitting portions (13a and 13b) as illustrated to raise the light-absorbing effect of the light-absorbing portion 13c.

The light-emitting portions (13a and 13b) can be formed to have the same energy bandgap, but to obtain light with wide-range spectral components close to natural light, the energy bandgap is preferably varied between the light-emitting portions (13a and 13b).

Furthermore, by adopting a multiple quantum well structure for the active layer 13, the emission efficiency at the light-emitting portions can be further improved.

Figure 3:
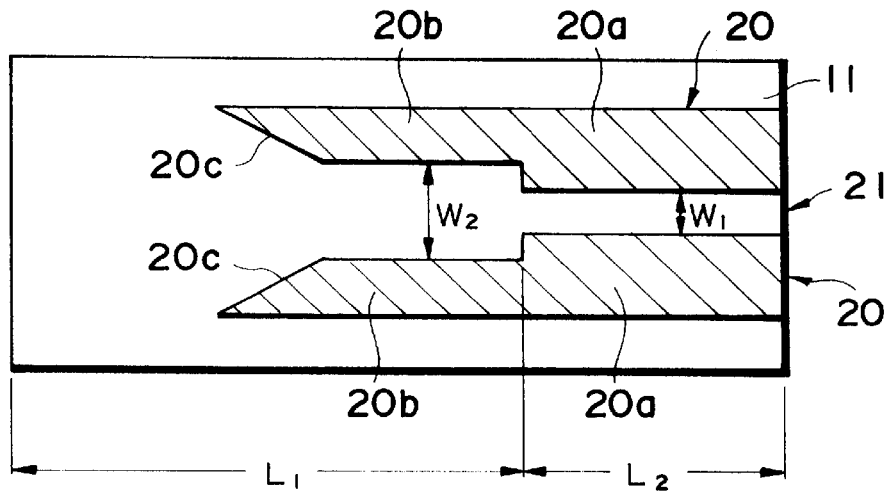
FIG. 3 is a plan view showing a manufacturing step (step 1) of the light-emitting diode according to the present invention.

Referring to FIGS. 3 to 8, description will move on to a manufacturing method whereby to form the light-emitting diode 10 shown in FIGS. 1 and 2 relatively easily. As shown in FIG. 3, on the substrate 11, a pair of mask portions 20, 20 are formed which are made of a dielectric, such as a silicon oxide film (SiO2) or a silicon nitride film (SiN), for example.

The mask portions 20, 20 as components of a mask 21, which are separated from each other, are provided in the longitudinal direction of the substrate 11. Each mask portion 20 includes a wide portion 20a with a length of substantially L2 from the other end of the substrate 1, and a narrow portion 20b. The wide portions 20a, 20a spaced a constant distance of W1 from each other extend in the longitudinal direction of the substrate 11 and the narrow portions 20b, 20b spaced a much wider distance from each other extend from the wide portions 20a, 20a in the longitudinal direction of the substrate 11. The narrow portions 20b have tapered end portions 20c, the distance of which becomes wider as one moves toward the extreme end points.

On the substrate 11 on which the mask 21 has been formed, by using a selective deposition method combining this mask with chemical vapor deposition, a multilayer structure, including the first clad layer 12, the active layer 13 and the second clad layer 14, is formed.

For the chemical vapor deposition method, an organic metal vapor deposition technique can be adopted. According to this selective deposition method utilizing this vapor deposition technique, as is conventionally well known, a supplied semiconductor material gas is deposited epitaxially by thermal decomposition on a substrate 11 not covered with the mask portions 20. The material gas supplied on the mask portions 20 does not react on the mask portions 20 but move to and is deposited epitaxially on the exposed portions of the substrate 11.

Consequently, the growth rate of a deposited semiconductor layer differs between the locations close to and the locations remote from the two mask portions 20 on the substrate 11, which gives rise to differences in thickness of the semiconductor layer or produces different crystal compositions, thus resulting in the formation of regions of different bandgaps.

Figure 4:
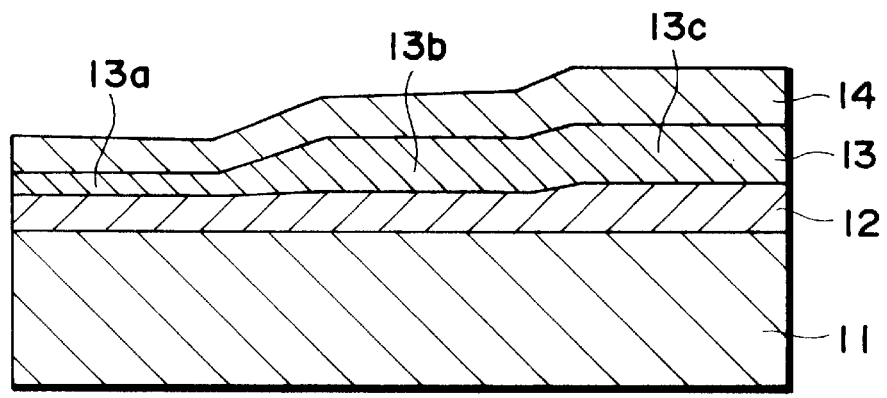
FIG. 4 is a longitudinal sectional view showing a manufacturing step (step 2) of the light-emitting diode according to the present invention.

Thus, by the selective deposition, the first clad layer 12, the active layer 13, and the second clad layer 14 each have the smallest thickness in the region at one end of the substrate 11, shown at left of FIG. 4, a slightly larger thickness in the middle region corresponding to the mask portion with the large internal space (W2), and a much larger thickness in the region corresponding to the mask portion with the small internal space (W1).

With the first clad layer 12 and the second clad layer 14 by growth of InP, partial substitution of material does not occur because of their composition, nor do changes occur in their bandgaps according to the changes in the thickness due to the above-mentioned differences in growth rate. Therefore, the bandgaps of the two clad layers 12 and 14 are maintained constant in the longitudinal direction.

On the other hand, in the active layer 13 of InGaAsP, the component elements of Ga and In belong to the same group (third group), but those elements of the same group have different diffusion lengths, so that when the active layer 13 is deposited, partial substitution occurs in the material (Ga and In). Therefore, bandgap differences arise according to the thickness variation due to the differences in the growth rate.

For this reason, in the active layer 13, the region 13a of the smallest thickness has the largest bandgap, the middle region 13b of the intermediate thickness has the intermediate bandgap, and the region of the largest thickness has the smallest bandgap. Those regions correspond to the left region 13a, the middle region 13b, and the right region 13c.

Figure 5:
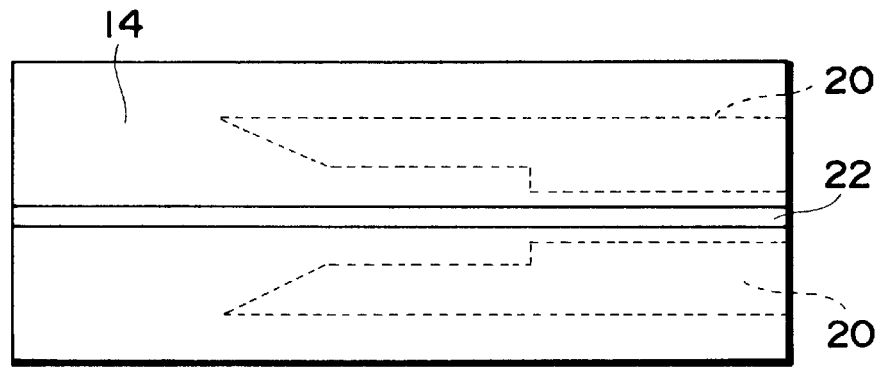
FIG. 5 is a plan view showing a manufacturing step (step 3) of the light-emitting diode according to the present invention.
Figure 6:
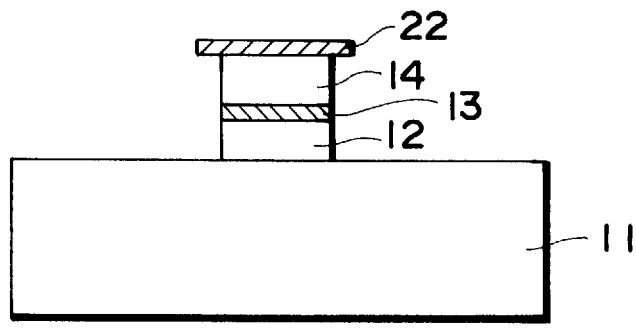
FIG. 6 is a end view showing a manufacturing step (step 4) of the light-emitting diode according to the present invention.

After the formation of the multilayer structure shown in FIG. 4, including the first clad layer 12, the active layer 13, and the second clad layer 13, as shown in FIG. 5, a selective deposition mask 22 is formed extending in the center zone throughout the overall length of the substrate 11 and covering the top face of the multilayer structure. This mask is used to obtain a multilayer portion in a narrow strip form. By selective etching using this mask 22, the multilayer structure is processed to form a strip with a width of 2 to 5 micron, for example, which is smaller than the mode field diameter of a single mode optical fiber as shown in FIG. 6.

Figure 7:
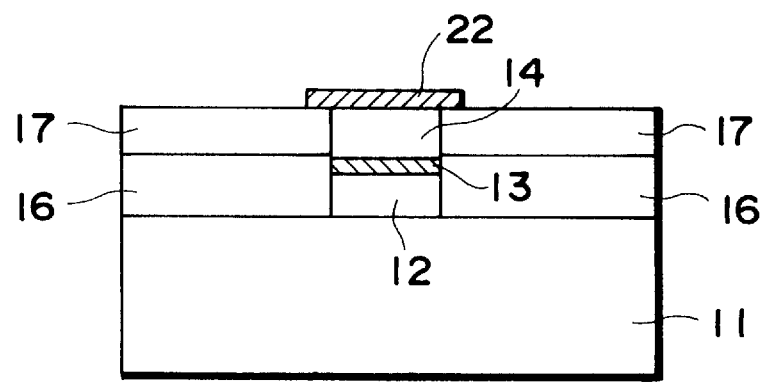
FIG. 7 is an end view showing a manufacturing step (step 5) of the light-emitting diode according to the present invention.

Subsequently, as shown in FIG. 7, the first block layer 16 and the second block layer 17 are formed by chemical vapor deposition utilizing the mask 22, for example, to cover the both lateral sides of the multilayer strip including the layers 12, 13 and 14.

Figure 8:
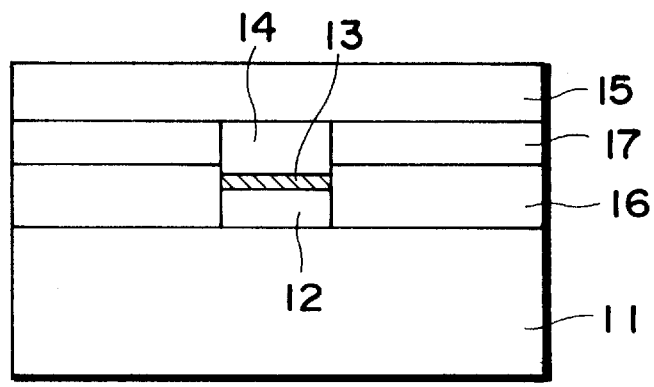
FIG. 8 is an end view showing a manufacturing step (step 6) of the light-emitting diode according to the present invention.

After the block layers 16 and 17 are formed, the mask 22 is removed, and as shown in FIG. 8, a contact layer 15 is formed, for example, by chemical vapor deposition to cover on the same plane the second clad layer 14 and the second block layers 17 lying across the second clad layer 14.

Electrodes 18 and 19, identical with those shown in FIG. 1, are formed in the specified regions on the top face of the contact layer 15 and on the bottom face of the substrate 11, by which step a light-emitting diode 10 shown in FIG. 2 can be completed.

As the mask 21 for selective deposition, it is possible to use a mask of any of various shapes other than that shown in FIG. 3, including on in which the mask portions 20 have on internal space which gradually widening toward the one end of the substrate 11.

Next, description will be made of an embodiment in which the active layer 13 is formed in a quantum well structure of 1.3 micron band. The bandgap wavelength and the thickness of a well layer of the quantum well structure are 1.38 microns and 7 nm, respectively, while the bandgap wavelength and the thickness of barrier layer are 1.10 micron and 10 nm, respectively, the number of wells being 10.

The active layer 13 of quantum well structure was formed by using masks 20, of which the internal space W2 is 20 microns and the width of the wide mask portion 20a is 80 microns. As the result of examination of the the emission characteristics of the active layer 13 of quantum well structure, it was found that the photoluminescence peak wavelength at the light-emitting portion 13b moved 80 nm closer to the long wavelength side than that at the light-emitting portion 13a.

As the length L2 of the light-absorbing portion 13c, a suitable value is preferably set according to the difference between the bandgap in the light-absorbing portion 13c and the bandgaps in the light-emitting portion 13a and the light-emitting portion 13b.

When there is a relatively large bandgap difference between the light-emitting portion and the light-absorbing portion, even if the length L2 of the light-absorbing portion 13c is relatively small, the light causing end-face reflection can be effectively absorbed by the light-absorbing portion. When the bandgap difference is small, a desired effect of light absorption can be achieved by increasing the length L2 of the light-absorbing portion 13c.

In the light-emitting diode according to the present invention, as mentioned above, the light-emitting portion and the light-absorbing portion are formed continuously in the active layer portion functioning as the optical waveguide and, consequently, in the optical waveguide extending from the light-emitting portion to the light-absorbing portion, there are no sharp changes in refractive index which cause the light going from the light-emitting portion to the light-absorbing portion to reflect. Therefore, the light traveling from the light-emitting portion to the light-absorbing portion is securely guided to and absorbed by the light-absorbing portion.

Therefore, according to the present invention, it is possible to reliably prevent reflection in the light-emitting diode and reliably suppress laser oscillation by stimulated emission, and therefore it is possible to obtain a light-emitting diode with stable temperature characteristics.

Further, according to the light-emitting diode manufacturing method, as described above, active layers with different bandgaps can be continuously formed relatively easily, which makes it possible to construct a light-emitting diode with stable temperature characteristics relatively easily.

What is claimed is:

1. A light-emitting diode comprising:

an active layer formed on a substrate, said active layer being surrounded jointly by a pair of clad layers and a pair of block layers, wherein said active layer includes a light-emitting portion and a light-absorbing portion continuously formed in one body, said light-emitting portion emitting light when carriers are injected thereinto between said pair of clad layers, said light-absorbing portion absorbing the light coming from the light-emitting portion.

2. A light-emitting diode according to claim 1, wherein a bandgap of said light-absorbing portion of said active layer is smaller than that of said light-emitting portion of said active layer.

3. A light-emitting diode according to claim 2, wherein the bandgap of said light-emitting portion increases in a direction away from said light-absorbing portion.

4. A light-emitting diode according to claim 1, wherein the thickness of said light-emitting portion of said active layer is smaller than that of said light-absorbing portion.

5. A light-emitting diode according to claim 1, wherein the width of said light-emitting portion of said active layer is larger than that of said light-absorbing portion.

* * * * *